United States Patent
Yeh et al.

(10) Patent No.: US 9,811,458 B2
(45) Date of Patent: Nov. 7, 2017

(54) MOBILE ELECTRONIC DEVICE AND METHOD FOR CLEARING MEMORY BLOCKS BASED ON PROCESSOR DETERMINATION OF PHYSICAL BLOCK TO ERASE IN RESPONSE TO GUI INPUT FROM USER SPECIFIED TIME AND DIRECTING CONTROLLER TO ERASE WITHIN THE SPECIFIED TIME

(71) Applicant: HTC Corporation, Taoyuan County (TW)

(72) Inventors: Fu-Jen Yeh, Taoyuan County (TW); Yi-Hsin Liao, Taoyuan County (TW); Chia-Yin Lu, Taoyuan County (TW); Shih-Hung Chu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 210 days.

(21) Appl. No.: 14/218,992

(22) Filed: Mar. 19, 2014

(65) Prior Publication Data
US 2015/0269070 A1 Sep. 24, 2015

(51) Int. Cl.
*G06F 12/02* (2006.01)
*G11C 16/16* (2006.01)

(52) U.S. Cl.
CPC .......... *G06F 12/0246* (2013.01); *G11C 16/16* (2013.01); *G06F 2212/7205* (2013.01); *G11C 2216/18* (2013.01)

(58) Field of Classification Search
CPC combination set(s) only.
See application file for complete search history.

(56) References Cited

U.S. PATENT DOCUMENTS

| 7,774,390 B2 | 8/2010 | Shin | |
| 8,285,869 B1 * | 10/2012 | Graetz | 709/233 |
| 2003/0023410 A1 * | 1/2003 | Roth | 702/188 |

(Continued)

FOREIGN PATENT DOCUMENTS

| CN | 102073571 | 5/2011 |
| CN | 102306095 | 1/2012 |

(Continued)

OTHER PUBLICATIONS

DiskEraser. Article [online]. University of Delaware, Jun. 26, 2013 [retrieved on Aug. 13, 2015]. Retrieved from the internet <https://web.archive.org/web/20130626225453/http://www.udel.edu/it/help/pii/erasing/wde_windows.html>.*

(Continued)

*Primary Examiner* — Daniel Tsui
*Assistant Examiner* — Chie Yew
(74) *Attorney, Agent, or Firm* — JCIPRNET

(57) ABSTRACT

A mobile electronic device including an interface unit, a semiconductor storage device and a processor is provided. The interface unit provides a user interface to receive a user input. The semiconductor storage device includes a controller and a non-volatile memory. The non-volatile memory is coupled to the controller and includes a plurality of memory blocks. The processor is coupled to the interface unit and the semiconductor storage device. The processor sends a signal to the semiconductor storage device in response to the user input. The controller clears at least one of the memory blocks in response to the signal.

13 Claims, 4 Drawing Sheets

(56) References Cited

U.S. PATENT DOCUMENTS

| | | | |
|---|---|---|---|
| 2003/0156347 A1* | 8/2003 | Ishii .......................... 360/78.04 |
| 2004/0145952 A1 | 7/2004 | Chen et al. |
| 2006/0101400 A1* | 5/2006 | Capek .................. G06F 9/4843 |
| | | | 717/120 |
| 2007/0174579 A1* | 7/2007 | Shin .............. 711/170 |
| 2009/0198887 A1* | 8/2009 | Watanabe et al. ............ 711/114 |
| 2009/0259896 A1* | 10/2009 | Hsu et al. ..................... 714/723 |
| 2009/0319720 A1* | 12/2009 | Stefanus et al. ............. 711/103 |
| 2010/0180066 A1* | 7/2010 | Powell .......................... 711/103 |
| 2011/0231599 A1* | 9/2011 | Kawamura et al. .......... 711/103 |
| 2011/0320700 A1* | 12/2011 | Bronson et al. .............. 711/106 |
| 2012/0110247 A1* | 5/2012 | Eleftheriou et al. .......... 711/103 |
| 2012/0110249 A1* | 5/2012 | Jeong et al. .................. 711/103 |
| 2012/0191937 A1* | 7/2012 | Feldman et al. .............. 711/170 |
| 2013/0060904 A1* | 3/2013 | Ur .......................... H04L 67/06 |
| | | | 709/219 |
| 2013/0124785 A1 | 5/2013 | Xiong et al. |
| 2013/0166818 A1 | 6/2013 | Sela |

FOREIGN PATENT DOCUMENTS

| | | |
|---|---|---|
| CN | 102622310 | 8/2012 |
| CN | 103577240 | 2/2014 |
| CN | 103608866 | 2/2014 |
| JP | 2011159065 | 8/2011 |
| TW | 200951711 | 12/2009 |
| TW | 201411346 | 3/2014 |

OTHER PUBLICATIONS

SSDToolbox. Article [online]. PC perspective, Oct. 27, 2011 [retrieved on Aug. 13, 2015]. Retrieved from the internet <http://www.pcper.com/news/Storage/Intel-Releases-Updated-SSD-Toolbox>.*

Jurgens, Gabriel. 'jquery execute function when two conditions are met' [online]. stackoverflow, Jun. 1, 2012 at 15:18 [retrieved on May 21, 2016]. Retrieved from the Internet <http://stackoverflow.com/questions/10852561/query-execute-function-when-two-conditions-are-met>.*

"Office Action of German Counterpart Application", dated Jan. 19, 2016, p. 1-p. 10.

"Office Action of China Counterpart Application," dated Jun. 20, 2017, p. 1-p. 12, in which the listed references were cited.

* cited by examiner

MOBILE ELECTRONIC DEVICE AND METHOD FOR CLEARING MEMORY BLOCKS BASED ON PROCESSOR DETERMINATION OF PHYSICAL BLOCK TO ERASE IN RESPONSE TO GUI INPUT FROM USER SPECIFIED TIME AND DIRECTING CONTROLLER TO ERASE WITHIN THE SPECIFIED TIME

BACKGROUND OF THE INVENTION

1. Field of the Invention

The invention relates to a mobile electronic device, and particularly relates to a method for clearing memory blocks of the mobile electronic device.

2. Description of Related Art

FIG. 1 is a schematic diagram illustrating a conventional flash memory 100. The flash memory 100 includes two memory blocks 110 and 120, and each of the memory blocks includes 16 memory pages. Initially, a file takes up five memory pages A1 to E1 of the memory block 110, as shown in FIG. 1.

A characteristic of the flash memory is that units for data programming and data erasing are not symmetrical. Specifically, the unit for data programming is the memory page, which is smaller, and the unit for data erasing is the memory block, which is larger. Thus, when the content of the file is modified, the original memory pages A1 to E1 are not overwritten. Instead, the modified file is written to subsequent memory pages A2 to E2, as shown in FIG. 2. If the content of the file is then further modified, the file that is newly modified will be written to subsequent pages A3 to E3, and so on so forth. Older data in the memory pages A1 to E1 and A2 to E2 are also termed as invalid data.

The conventional mobile electronic device uses flash memory as the main storage device, e.g. solid state disks (SSD) or embedded multimedia cards (eMMC), for storing an operating system, applications, and a variety of data. However, fragmentation, as shown in FIG. 2, may be found after the flash memory is used for a period of time. In other words, the memory blocks may store a certain amount of invalid data. If the invalid data are not cleared, the free memory blocks will become less and less as the invalid data accumulate.

To recycle the memory pages A1 to E1 and A2 to E2 taken up by the invalid data, the valid data in the memory pages A3 to E3 may be copied to another memory block 120, and then the memory block 110 is erased, as shown in FIG. 3. This kind of recycling process is termed as garbage collection. Garbage collection usually takes a long time, which may make the mobile electronic device operate with delay or cease to function and may thus influence user experience.

SUMMARY OF THE INVENTION

The invention provides a mobile electronic device and a method for clearing memory blocks that are capable of solving problems caused by fragmentation while maintaining the user experience.

The mobile electronic device includes an interface unit, a semiconductor storage device and a processor. The interface unit provides a user interface to receive a user input. The semiconductor storage device includes a controller and a non-volatile memory. The non-volatile memory is coupled with the controller and includes a plurality of memory blocks. The processor is coupled with the interface unit and the semiconductor storage device and sends a signal to the semiconductor storage device in response to the user input. The controller thus clears at least one of the memory blocks in response to the signal.

The method for clearing the memory blocks provided in the invention is executed by a mobile electronic device and includes steps as follows: providing a user interface to receive a user input; sending a signal in response to the user input; and clearing at least one of the memory blocks of the non-volatile memory in response to the signal.

In view of the foregoing, the memory block clearing according to the invention is activated by the user input from the user interface. Therefore, the user may decide when to clear the memory blocks, and the use of the mobile electronic device is thus not influenced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1-3 are schematic diagrams illustrating conventional garbage collection of a flash memory.

DESCRIPTION OF THE EMBODIMENTS

Figure 4:
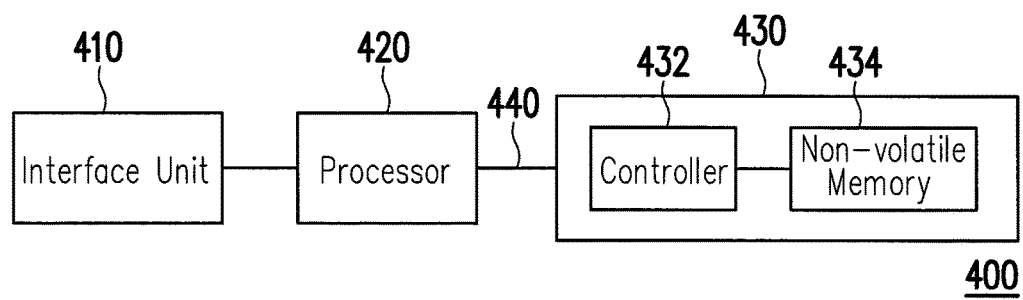
FIG. 4 is a schematic diagram illustrating a mobile electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 4 is a schematic diagram illustrating a mobile electronic device 400 according to an embodiment of the invention. The mobile electronic device 400 may be a cell phone, a personal digital assistant (PDA), a tablet computer, or a smart wearable electronic device. The mobile electronic device 400 includes an interface unit 410, a processor 420, and a semiconductor storage device 430. The processor 420 is coupled with the interface unit 410 and the semiconductor storage device 430. The semiconductor storage device 430 includes a controller 432 and a non-volatile memory 434. The non-volatile memory 434 is coupled with the controller 432, and the non-volatile memory 434 includes a plurality of memory blocks.

The interface unit 410 provides a user interface for the user to operate. The user interface includes an input part and an output part. Regarding the output part, the user interface provided by the interface unit 410 may output a variety of messages to the user by means of image, voice, or braille, etc. Regarding the input part, the user interface provided by the interface unit 410 may receive a user input through a touch panel, a touch display, a virtual key, or a physical button. The mobile electronic device 400 further includes an operating system and a plurality of applications stored in the non-volatile memory 434. The processor 420 may execute the operating system and the plurality of applications.

The semiconductor storage device 430 may be a solid state disk (SSD) or an embedded multimedia card (eMMC). The controller 432 manages the non-volatile memory 434. The controller 432 may be considered as a bridge between the processor 420 and the non-volatile memory 434. The non-volatile memory 434 may be a flash memory or other kinds of non-volatile memory having asymmetrical data programming and data erasing units.

Figure 5:
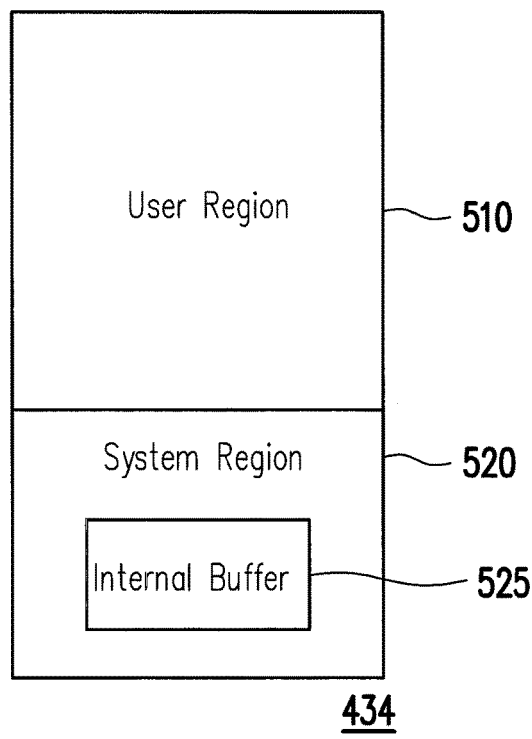
FIG. 5 is a schematic diagram illustrating a non-volatile memory according to an embodiment of the invention.

FIG. 5 is a schematic diagram illustrating the non-volatile memory 434 according to an embodiment of the invention. The non-volatile memory 434 includes a user region 510 and a system region 520. The user region 510 is provided for the user and the processor 420 of the mobile electronic device 400 to use. In this embodiment, the user region 510 stores the operating system and the plurality of applications of the mobile electronic device 400, along with a variety of data associated with the operating system and applications. In addition, the system region 520 is provided for the controller 432 to use. The processor 420 may not directly access the system region 520. The system region 520 stores a firmware executed by the controller 432 and information required for the controller 432 to manage the non-volatile memory 434, such as had block information and an address translation table of the non-volatile memory 434. In addition, the system region 520 further includes an internal buffer 525. The user region 510, the system region 520, and the internal buffer 525 are formed of a plurality of memory blocks. In an embodiment, the non-volatile memory 434 is a flash memory. Each memory block of the flash memory includes a plurality of memory pages, and a capacity of each memory block is the same.

When the non-volatile memory 434 receives a data from the processor 424, a part of the data is directly stored in the user region 510. However, another part of the data is temporarily stored in the internal buffer 525, and then moved from the internal buffer 525 to be stored in the user region 510 after a writing process is completed. Smaller data that are constantly modified during operation of the operating system and the applications of the mobile electronic device 400, such as journal records of a file system, may be stored in the internal buffer 525. The journal records may include information such as file size, file modification time, file establishment time and logical address of file data in the non-volatile memory 434, etc.

Figure 6:
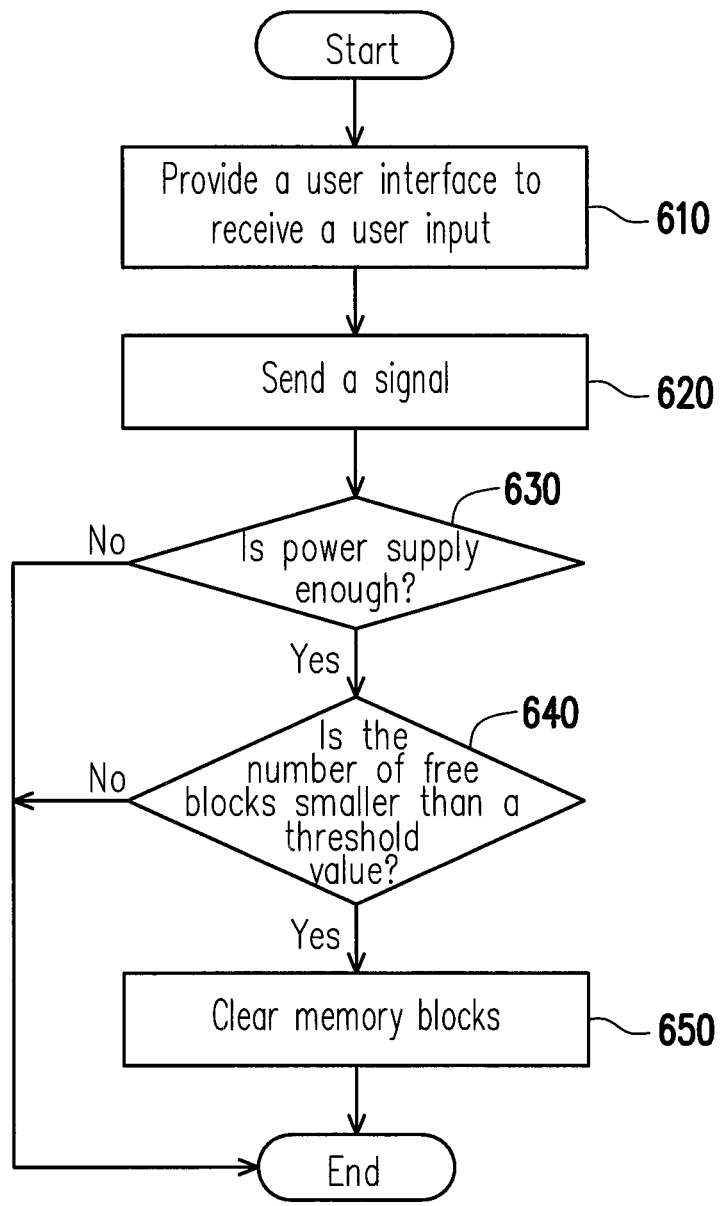
FIG. 6 is a flowchart illustrating a method for clearing memory blocks according to an embodiment of the invention.

FIG. 6 is a flowchart illustrating a method for clearing memory blocks according to an embodiment of the invention. The method may be executed by the mobile electronic device 400. At Step 610, the interface unit 410 provides the user interface to receive the user input. For example, the interface unit 410 may provide a plurality of options to inquire the user on whether the user allows the controller 432 to clear the non-volatile memory 434 or to inquire the user on time the user wants to give to the controller 432 for clearing the non-volatile memory 434. The user input may include one of the plurality of options. Since it may take a certain amount of time to clear the non-volatile memory 434, an operation of the mobile electronic device 400 during this time may be delayed or stopped. Therefore, it is necessary to inquire on the user's intention. At Step 620, the processor 420 sends a signal 440 to the semiconductor storage device 430 in response to the user input. The signal 440 represents the user input.

Then, at Step 630, after receiving the signal 440, the controller 432 checks whether power supply of the mobile electronic device 400 is enough to finish clearing the memory blocks, which may be partial or whole memory blocks, of the non-volatile memory 434. If the power supply in the battery of the mobile electronic device 400 is enough, or the mobile electronic device 400 is being charged, or the mobile electronic device 400 is synchronizing data with a personal computer, the controller 432 then determines that the power supply is enough to finish clearing the memory blocks and Step 640 is executed. Otherwise, the process is terminated without clearing the memory blocks. Checking at Step 630 is to prevent data stored in the non-volatile memory 434 from being damaged due to power outage.

At Step 640, the controller 432 further checks whether the number of free blocks in the region to be cleared (i.e. the user region 510, the system region 520, or the internal buffer 525) is smaller than a predetermined threshold value. If the number of free blocks in the region to be cleared is smaller than the predetermined threshold value, fragmentation is identified, and Step 650 is executed. Otherwise, it is not necessary to clear the memory blocks, and the process is terminated.

Figures 1, 2, 3:
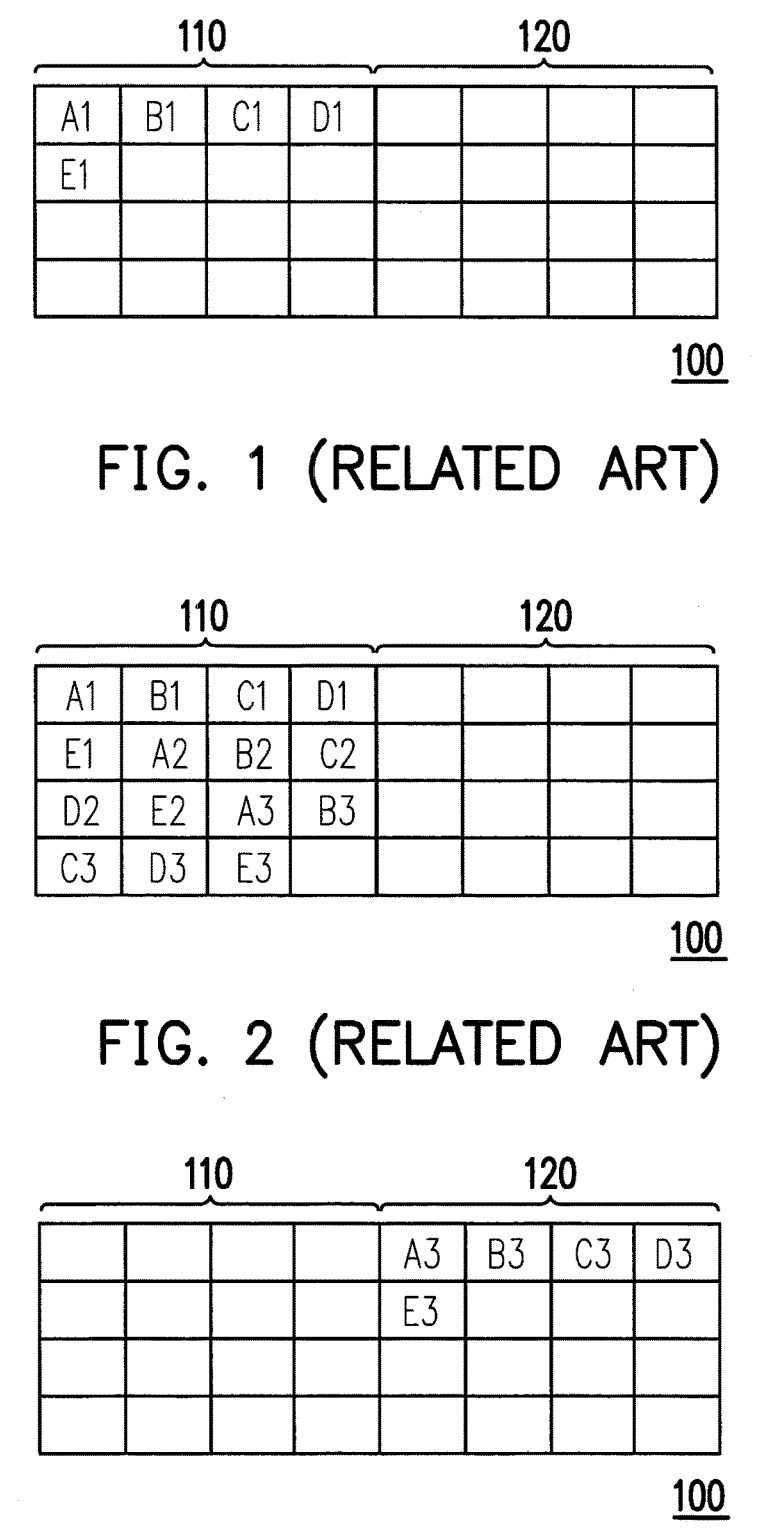

Then, at Step 650, the controller 432 clears at least one of the memory blocks of the non-volatile memory 432 in response to the signal 440. The memory block that is cleared may belong to the user region 510, the system region 520, or the internal buffer 525. The clearing mentioned above may be garbage collection shown in FIG. 3.

If the memory block that is cleared belongs to the internal buffer 525, another way of clearing may be used. The data in the internal buffer 525 are only temporarily stored without having to be permanently kept. Therefore, for each of the memory block to be cleared, the controller 432 may store valid data of the memory block to be cleared, erase data of the memory block, and mark the memory block as a free block. The controller 432 may clear all memory blocks of the internal buffer 525 in this way, or only clear a part of the memory blocks of the internal buffer 525. If each of the memory blocks of the internal buffer 525 is cleared in this way, the internal buffer 525 is cleared to be an initial state as dispatched from the factory.

Figure 7:
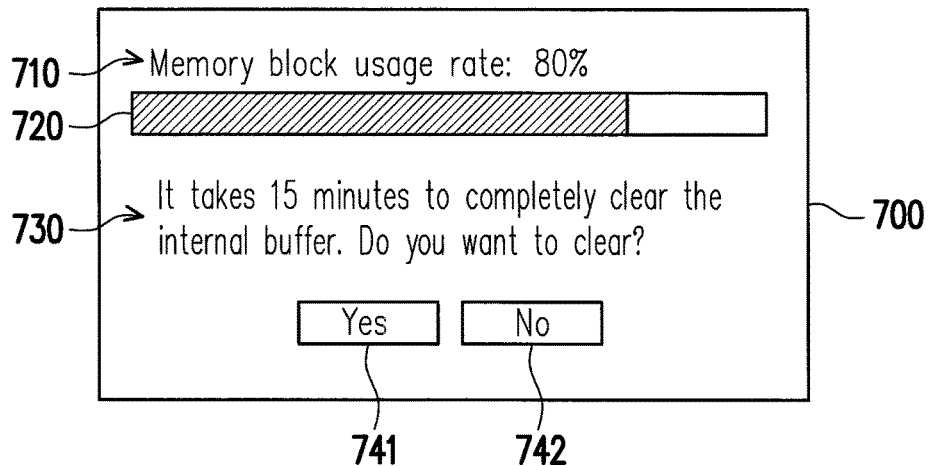
FIGS. 7-9 are schematic diagrams illustrating user interfaces according to different embodiments of the invention.

FIG. 7 is a schematic diagram illustrating a user interface 700 according to an embodiment of the invention. The user interface 700 may be generated by the operating system or the applications of the mobile electronic device 400. The user interface 700 may be displayed by a touch display of the interface unit 410 and receive a user input through the touch display. The user interface 700 includes information 710 and 730, a bar graph 720, and two options 741 to 742. The information 710 and the bar graph 720 indicate a memory block usage rate of the internal buffer 525. The information 730 indicates a time duration required to completely clear the internal buffer 525 (e.g. 15 minutes), and inquire the user on whether the user allows the controller 432 to completely clear the internal buffer 525.

The user may operate the user interface 700 to choose one option. If the user chooses the agreeing option 741 (Yes), it is indicated that the user agrees to completely clear the internal buffer 525. The processor 420 may send the signal 440 to notify the controller 432 to completely clear the internal buffer 525. Alternatively, the signal 440 may include the time duration of the information 730, so as to designate a time duration for the controller 432 to clear the internal buffer 525. No matter whether a goal of clearing is finished or not, the controller 432 may stop clearing the internal buffer 525 after the designated time duration lapses, such that the mobile electronic device 400 may be operated normally. If the user chooses the disagreeing option 742 (No), it is indicated that the user disagrees to perform the clearing step mentioned above. Thus, the processor 420 does not send the signal 440, so the controller 432 does not clear the memory blocks.

Figure 8:
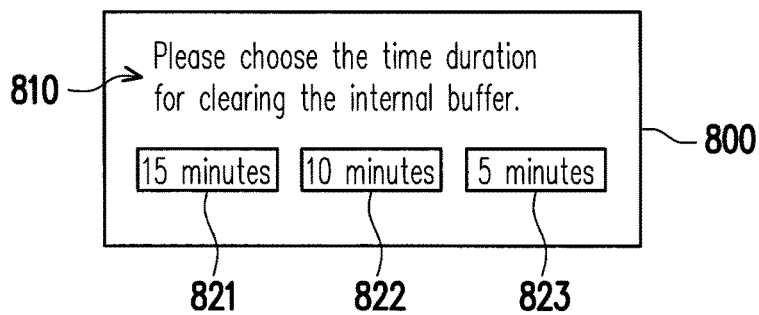

FIG. 8 is a schematic diagram illustrating a user interface 800 according to another embodiment of the invention. The user interface 800 includes information 810 and three options 821 to 823. The information 810 prompts the user to choose a time duration granted for the controller 432 to clear the internal buffer 525. As shown in FIG. 8, options 821 to 823 respectively correspond to different time durations. The longer the time duration chosen by the user, the more inconvenience caused to the operation of the mobile electronic device 400. However, the longer time duration may result in a better clearing of the memory blocks. When the user chooses one of the options, the processor 420 may include the time duration corresponding to the chosen option in the signal 440 and send the signal 440 to the controller 432. Thus, the signal 440 may designate a time duration for the controller 432 to clear memory blocks of the internal buffer 525. The number of memory blocks cleared by the controller 432 is positively proportional to the time duration.

Which memory blocks are to be cleared within the limited time duration may be determined by the processor 420 or the controller 432. If the processor 420 makes the determination, the processor 420 may choose a part of memory blocks that need to be cleared in the internal buffer 525 based on the time duration chosen by the user. In addition, the number of the part of the memory blocks is positively proportional to the time duration. The signal 440 may include the time duration and a physical address of the part in the non-volatile memory 434. The controller 432 may clear the part of the memory blocks within the time duration in response to the signal 440.

Figure 9:
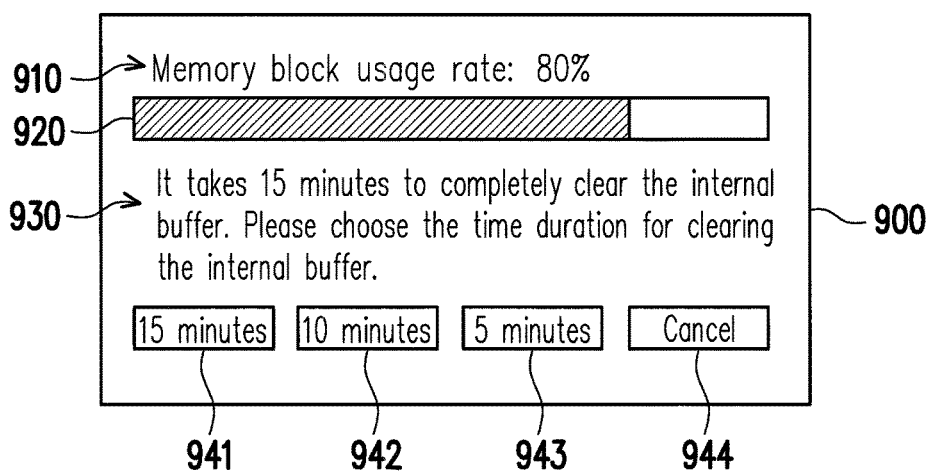

FIG. 9 is a schematic diagram illustrating a user interface 900 according to another embodiment of the invention. The user interface 990 includes information 910 and 930, a bar graph 920, and four options 941 to 944. The information 910 and the bar graph 920 indicate a memory block usage rate of the internal buffer 525. The information 930 indicates a time duration required to completely clear the internal buffer 525, and inquire the user on whether the user allows the controller 432 to completely clear the internal buffer 525. The user may choose one of the options 941 to 943, so as to designate a time duration for clearing the internal buffer 525. The user may also choose the option 944 to cancel the clearing process.

In view of the foregoing, the invention allows the user to decide whether to clear the non-volatile memory by him/herself, and also allows the user to decide the time duration for clearing the non-volatile memory by him/herself. Thus, the invention not only solves the fragmentation of the non-volatile memory but facilitates the user experience.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A mobile electronic device, comprising:
 an interface unit configured to provide a user interface to receive a user input, wherein the interface unit provides a plurality of options, and the user input comprises choosing one of the options, wherein the options respectively correspond to different time durations;
 a semiconductor storage device comprising a controller and a non-volatile memory, wherein the non-volatile memory is coupled with the controller and comprises a plurality of memory blocks; and
 a processor coupled with the interface unit and the semiconductor storage device, and configured to determine a chosen time duration based on the chosen option and choose a part of the plurality of memory blocks based on the chosen time duration, wherein a number of the part of the plurality of memory blocks is positively proportional to the chosen time duration,
 wherein the processor is further configured to identify one or more physical addresses of the part of the plurality of memory blocks and generate a signal which includes the chosen time duration and the one or more physical addresses of the part of the plurality of memory blocks, wherein the processor is further configured to send the signal to the controller,
 wherein the controller in response to receiving the signal, clears the part of the plurality of memory blocks according to the one or more physical addresses indicated by the received signal, so as to clear the part of the plurality of memory blocks within the chosen time duration,
 wherein after receiving the signal, the controller checks whether power supply of the mobile electronic device is enough to finish clearing the part of the plurality of memory blocks, and the controller executes clearing the part of the plurality of memory blocks only when the power supply is enough to finish clearing the part of the plurality of memory blocks.

2. The mobile electronic device as claimed in claim 1, wherein the non-volatile memory is a flash memory.

3. The mobile electronic device as claimed in claim 1, further comprising an operating system and a plurality of applications, wherein the non-volatile memory comprises a user region and a system region, the user region stores the operating system and the plurality of applications, the system region stores information required for the controller to manage the non-volatile memory, and the part of the plurality of memory blocks cleared by the controller belongs to the system region.

4. The mobile electronic device as claimed in claim 3, wherein the system region comprises an internal buffer, and the part of the plurality of memory blocks cleared by the controller belongs to the internal buffer.

5. The mobile electronic device as claimed in claim 4, wherein when the non-volatile memory receives a data, a part of the data is directly stored in the user region, and another part of the data is temporarily stored in the internal buffer and then moved from the internal buffer to and stored in the user region.

6. The mobile electronic device as claimed in claim 4, wherein the controller clears the part of the plurality of memory blocks by storing valid data of the part of the plurality of memory blocks to be cleared in the user region, erasing data of the part of the plurality of memory blocks, and marking the part of the plurality of memory blocks as a free block.

7. The mobile electronic device as claimed in claim 4, wherein after receiving the signal, the controller checks whether a number of free blocks in the internal buffer is smaller than a threshold value, and the controller executes clearing the part of the plurality of memory blocks only when the number of free blocks is smaller than the threshold value.

8. A method for clearing a plurality memory blocks, executed by a mobile electronic device having a semiconductor storage device comprising a controller and a non-volatile memory that is coupled with the controller and the non-volatile memory comprises the plurality of memory blocks, the method comprising:
provideng a user interface to receive a user input, wherein the user interface comprises a plurality of options, and the user input comprises choosing one of the options, wherein the options respectively correspond to different time durations;
determining, by a processor, a chosen time duration based on the chosen option and choosing a part of the plurality of memory blocks based on the chosen time duration, wherein a number of the part of the plurality of memory blocks is positively proportional to the chosen time duration;
identifying, by the processor, one or more physical addresses of the part of the plurality of memory blocks and generating a signal which includes the chosen time duration and the one or more physical addresses of the part of the plurality of memory blocks;
sending, by the processor, the signal to the controller;
clearing, by the controller in response to receiving the signal, the part of the plurality of memory blocks of the non-volatile memory in response to the signal according to the one or more physical addresses indicated by the received signal, so as to clear the part of the plurality of memory blocks within the chosen time duration;
after receiving the signal, checking, by the controller, whether power supply of the mobile electronic device is enough to finish clearing the part of the plurality of memory blocks;
executing, by the controller, clearing the part of the plurality of memory blocks only when the power supply is enough to finish clearing the part of the plurality of memory blocks.

9. The method for clearing the plurality of memory blocks as claimed in claim 8, wherein the non-volatile memory comprises a user region and a system region, the user region stores an operating system and a plurality of applications of the mobile electronic device, the system region stores information required for the controller to manage the non-volatile memory, and the part of the plurality of memory blocks that is cleared belongs to the system region.

10. The method for clearing the plurality of memory blocks as claimed in claim 9, wherein the system region comprises bad block information of the non-volatile memory, an address translation table of the non-volatile memory, and an internal buffer, and the part of the plurality of memory blocks that is cleared belongs to the internal buffer.

11. The method for clearing the plurality of memory blocks as claimed in claim 10, further comprising:
receiving a data by the non-volatile memory;
directly storing a part of the data in the user region;
temporarily storing another part of the data in the internal buffer; and
moving the another part of the data from the internal buffer to the user region and storing the another part of the data in the user region.

12. The method for clearing the plurality of memory blocks as claimed in claim 10, wherein clearing the part of the plurality of memory blocks of the non-volatile memory further comprises:
storing, by the controller, valid data of the part of the plurality of memory blocks to be cleared in the user region;
erasing, by the controller, data of the part of the plurality of memory blocks; and
marking, by the controller, the part of the plurality of memory blocks as a free block.

13. The method for clearing the plurality of memory blocks as claimed in claim 10, further comprising:
after receiving the signal, checking, by the controller, whether a number of free blocks in the internal buffer is smaller than a threshold value; and
executing clearing, by the controller, the part of the plurality of memory blocks only when the number of free blocks is smaller than the threshold value.

\* \* \* \* \*